United States Patent [19]

Kunihiro

[11] Patent Number: 5,340,318
[45] Date of Patent: Aug. 23, 1994

[54] CONDUCTIVE ELASTOMERIC ELEMENT ELECTRONIC CONNECTOR ASSEMBLY

[75] Inventor: James J. Kunihiro, Perkasie, Pa.

[73] Assignee: Elastomeric Technologies, Inc., Hatboro, Pa.

[21] Appl. No.: 988,411

[22] Filed: Dec. 9, 1992

Related U.S. Application Data

[63] Continuation of Ser. No. 865,780, Apr. 7, 1992, abandoned, which is a continuation of Ser. No. 702,914, May 20, 1991, abandoned.

[51] Int. Cl.$^5$ .................................. H01R 9/09
[52] U.S. Cl. ............................. 439/66; 439/74; 439/86; 439/91; 439/591
[58] Field of Search ............... 439/66, 74, 86, 87, 439/91, 591

[56] References Cited

U.S. PATENT DOCUMENTS

| | | | |
|---|---|---|---|
| 3,680,037 | 7/1972 | Nellis et al. | 439/591 |
| 4,437,718 | 3/1984 | Selinko | 439/591 |
| 4,593,961 | 6/1986 | Cosmo . | |
| 4,699,593 | 10/1987 | Grabbe et al. | 439/66 |
| 5,007,841 | 4/1991 | Smolley | 439/66 |
| 5,037,312 | 8/1991 | Casciotti et al. | 439/66 |

FOREIGN PATENT DOCUMENTS

89/02664  3/1989  PCT Int'l Appl. .

*Primary Examiner*—P. Austin Bradley
*Attorney, Agent, or Firm*—Ratner & Prestia

[57] ABSTRACT

A conductive elastomeric element electronic connector assembly in which a plurality of conductive elastomeric connector elements are held in openings in a connector element carrier positioned between a pair of spaced substrates having contact pads which are to be connected together electrically. Each connector element has a volume within the confines of the opening in which it is held which is less than the volume of the opening, so that upon axial compression of the connector element, which occurs as the substrates are brought together to establish contact between the contact pads and the ends of the connector elements, the connector elements can deflect and expand into the extra space in the openings in which they are held.

8 Claims, 1 Drawing Sheet

CONDUCTIVE ELASTOMERIC ELEMENT ELECTRONIC CONNECTOR ASSEMBLY

This application is a continuation of U.S. application Ser. No. 07/865,780 filed Apr. 7, 1992 now abandoned which is a continuation of U.S. application Ser. No. 07/702,914 filed May 20, 1991 now abandoned.

TECHNICAL FIELD

The present invention relates, in general, to assemblies for connecting electronic components and, in particular, to the electrical connection of circuit boards and the like by means of conductive elastomeric connector elements.

BACKGROUND OF THE INVENTION

The use of conductive elastomeric elements in the electronics industry, although fairly common, has been limited because of the costs associated with the manufacture of these elements and the high deflective forces required for the elements to make adequate contact with the components being electrically connected.

SUMMARY OF THE INVENTION

A conductive elastomeric element electronic connector assembly, constructed in accordance with the present invention, includes a pair of spaced substrates each having a plurality of contact pads on a surface thereof facing the surface of the other substrate having contact pads. Selected contact pads on one of the substrates are associated with selected contact pads on the other substrate. This connector assembly also includes a connector element carrier positioned between the substrates and having a plurality of openings extending through the thickness thereof and a plurality of conductive elastomeric connector elements extending through and held in the openings in the connector element carrier. Each of the conductive elastomeric connector elements electrically connects associated contact pads on the substrates and has a volume within the confines of the opening in which it is held which is less than the volume of the opening. As a result, each elastomeric connector element can expand into the extra space within the opening in which it is held as the connector element deflects when it is compressed axially as the unit is being assembled.

DETAILED DESCRIPTION OF THE INVENTION

Figure 1:
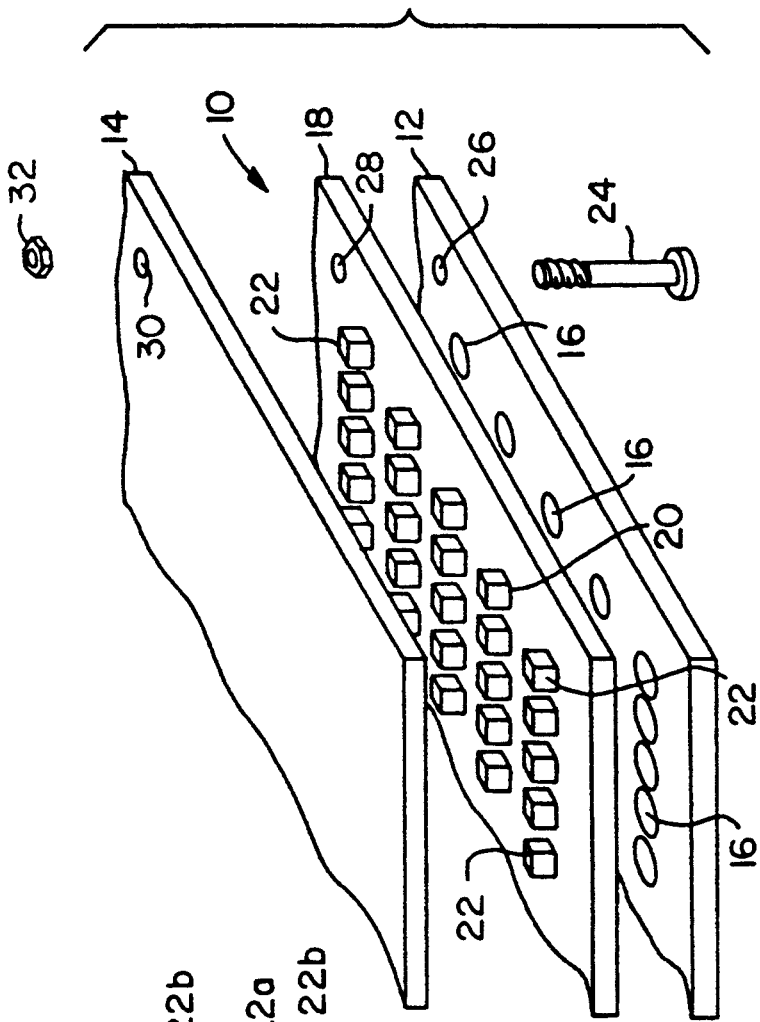
FIG. 1 is an exploded perspective view of a conductive elastomeric element electronic connector assembly constructed in accordance with the present invention.

Referring to the drawing, a conductive elastomeric element electronic connector assembly 1, constructed in accordance with the present invention, includes a conductive elastomeric element electronic connector 10 and a pair of spaced substrates 12 and 14, with connector 10 positioned between substrates 12 and 14. Substrates 12 and 14 can be the support bases of conventional printed circuit boards on which components (not shown) are mounted. Each of the substrates 12 and 14 has a plurality of contact pads 16 on a surface which faces the other substrate. Only the contact pads on the upper surface of substrate 12 are shown in FIG. 1. However, a similar plurality of contact pads are provided on that surface of substrate 14 which faces substrate 12, namely the lower surface of substrate 14, so that selected contact pads on the substrates are associated with each other and are intended to be connected together electrically.

Conductive elastomeric element electronic connector 10 is adapted to electrically connect associated contact pads on substrates 12 and 14. Connector 10 includes a connector element carrier 18 which is in the form of a planar sheet for the embodiment of the invention illustrated in FIG. 1. Connector element carrier 18 has a plurality of openings 20 which extend through the thickness of the connector element carrier. As shown most clearly in FIG. 3, openings 20 are circular for the embodiment of the invention being described.

Figure 2:
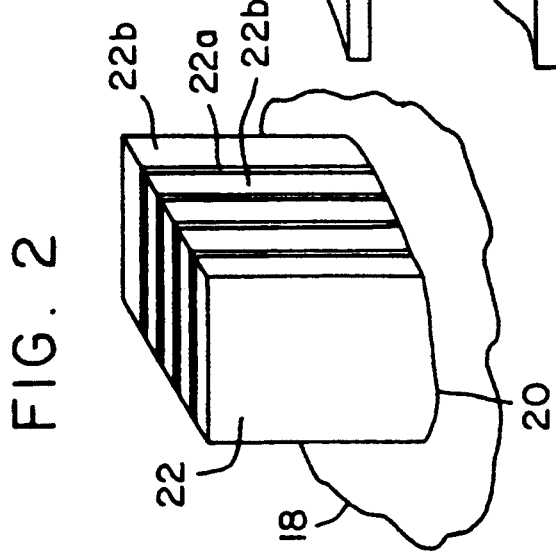
FIGS. 2 and 3 are perspective and plan views, respectively, of a portion of the FIG. 1 conductive elastomeric element electronic connector assembly showing a conductive elastomeric connector element held in an opening in the connector element carrier.
Figure 3:
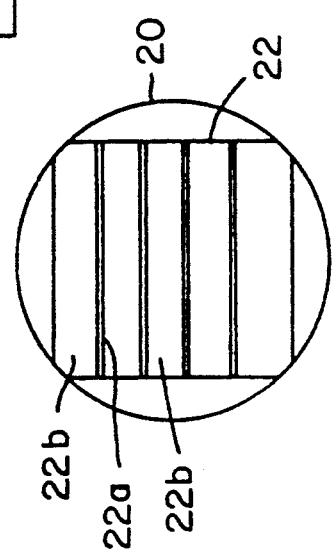

Connector 10 also includes a plurality of conductive elastomeric connector elements 22 which extend through and are held in openings 20. Conductive elastomeric connector elements 22 can be formed of layers of alternating conductive and nonconductive strips 22a and 22b as shown in FIGS. 2 and 3, or they can be solid with conductors dispersed or they can be alternating concentric conductive and nonconductive rings, or they can take some other suitable form which is effective in electrically connecting associated contact pads 16 on substrates 12 and 14 as the connector elements are subjected to axial compressive forces when the substrates and connector 10 are assembled as a unit. For a "dedicated" unit, such as the one being described, the locations of openings 20 and their associated connector elements 22 correspond to the arrays of contact pads 16 on substrates 12 and 14.

Conductive elastomeric connector elements 22 are held in their respective openings 20 in connector element carrier 18 sufficiently tightly, so that they will not fall out of their openings as connector 10 is being handled. This can be accomplished by a friction fit or more so by a press fit.

As shown most clearly in FIG. 3, for the embodiment of the invention being described, each of the conductive elastomeric connector elements 22 has a square cross-section, so that engagement between the connector elements and their respective openings 22 in connector element carrier 18 is at the corners of the squares. Also, as shown most clearly in FIG. 3 for the embodiment of the invention being described, each conductive elastomeric connector element 22 has a cross-sectional area which is smaller than the opening 20 in connector element carrier 18 in which the conductive elastomer connector element is being held. As a result, when connector 10 and substrates 12 and 14 are assembled into a unit, with the ends of conductive elastomeric connector elements 22 being brought into horizontal alignment as they make contact with their associated contact pads 16 on the substrates, each connector element can expand into the extra space within opening 20 in which it is being held as the connector element deflects when its is compressed axially because the connector element has a volume within the confines of the opening in which it is held which is less than the volume of the opening. Such axial compression and corresponding deflection of connector elements 22 occurs when a plurality of screws 24, only one of which is shown in FIG. 1, are passed through sets of aligned holes 26, 28 and 30 in substrate 12, connector element carrier 18 and substrate 14, respectively, and the screws are tightened into a plurality of nuts 32, only one of which is shown in FIG. 1. Of course, other means, such as rivets and hinged lids, can be used to bring together and maintain fastened in place connector 10 and substrates 12 and 14 and maintain the axial compression of the connector elements. The extra space in openings 20 can accommodate expansion of the connector element to the extent that the connector element does not self-align by sliding vertically within its opening or the connector element is made longer than other connector elements.

It will be apparent that connector elements 22 and openings 20 can have other cross-sectional shapes, so long as the connector elements are held in the openings and there is extra space in the openings into which the connector elements can expand as they are being deflected. For example, the connector elements can have triangular, rectangular or pentagonal cross-sections.

Also, connector carrier element 18 can be other than a planar sheet and can be adapted for electrically connecting parts other than printed circuit boards. For example, the connector element carrier can be recessed to receive a chip carrier.

While a preferred embodiment of the present invention has been described and certain modifications and substitutions have been identified, it will be apparent to those skilled in the art that various other modifications and substitutions can be made without departing from the true spirit and scope of the invention. Accordingly, it is understood that the present invention has been described by way of illustration and not limitation.

What is claimed is:

1. A conductive elastomeric element electronic connector assembly comprising:

a pair of spaced substrates disposed parallel to each other with each having an array of contact pads on a surface thereof facing the surface of the other of said substrates having said contact pads, selected contact pads on one of said substrates associated with selected contact pads on the other of said substrates and aligned on lines perpendicular to said substrates;

a connector element carrier positioned between said substrates and having an array of openings extending through the thickness thereof corresponding to said arrays of said contact pads on said substrates;

a plurality of conductive elastomeric connector elements extending individually along said lines perpendicular to said substrates through, projecting beyond, and held in said openings in said connector element carrier, each of said conductive elastomeric connector elements electrically connecting associated contact pads on said substrates and having a volume within the confines of the opening in which it is held which is sufficiently less than the volume of the opening to permit expansion of said conductive elastomeric connector element as said conductive elastomeric connector element is compressed axially;

and means for applying an axially compressive force to said conductive elastomeric connector elements and fastening together said pair of substrates and said connector element carrier and maintaining said axially compressive force on said conductive elastomeric connector elements.

2. A conductive elastomeric element electronic connector assembly according to claim 1 wherein each of said conductive elastomeric connector elements is in the form of alternating layers of conductive and nonconductive strips.

3. A conductive elastomeric element electronic connector assembly according to claim 1 wherein each of said openings extending through said connector element carrier is circular and each of said conductive elastomeric connector elements has a square cross-section.

4. A conductive elastomeric element electronic connector assembly according to claim 3 wherein said connector element carrier is a planar sheet and said substrates are bases of printed circuit boards.

5. A conductive elastomeric element electronic connector for electrically connecting a plurality of pairs of associated contact pads on surfaces of a pair of spaced substrates which face each other and are disposed parallel to each other with associated contact pads aligned on lines perpendicular to said substrates, said conductive elastomeric element electronic connector comprising:

a connector element carrier having an array of openings extending through the thickness thereof corresponding to the arrays of said contact pads on said substrates;

and a plurality of conductive elastomeric connector elements extending individually along said lines perpendicular to said substrates through, projecting beyond, and held in said openings in said connector element carrier, each of said conductive elastomeric connector elements having a volume within the confines of the opening in which it is held which is sufficiently less than the volume of the opening to permit expansion of said conductive elastomeric connector element as said conductive elastomeric connector element is compressed axially.

6. A conductive elastomeric element electronic connector according to claim 5 wherein each of said openings extending through said connector element carrier is circular and each of said conductive elastomeric connector elements has a square cross-section.

7. A conductive elastomeric element electronic connector according to claim 5 wherein each of said conductive elastomeric connector elements is in the form of alternating layers of conductive and nonconductive strips.

8. A conductive elastomeric element electronic connector according to claim 5 wherein said connector element carrier is a planar sheet.

* * * * *